United States Patent
Hsu (10) Patent No.: US 12,287,560 B2
(45) Date of Patent: Apr. 29, 2025

(54) LIGHT SOURCE MODULE AND PROJECTOR

(71) Applicant: Coretronic Corporation, Hsin-Chu (TW)

(72) Inventor: Kun-Chen Hsu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 526 days.

(21) Appl. No.: 17/847,201

(22) Filed: Jun. 23, 2022

(65) Prior Publication Data

US 2023/0016205 A1     Jan. 19, 2023

(30) Foreign Application Priority Data

Jul. 16, 2021    (CN) .......................... 202110804182.8

(51) Int. Cl.
    *G03B 21/16*       (2006.01)
    *G03B 21/20*       (2006.01)
           (Continued)

(52) U.S. Cl.
    CPC ......... *G03B 21/16* (2013.01); *G03B 21/2033* (2013.01); *H01S 5/022* (2013.01); *H01S 5/02469* (2013.01)

(58) Field of Classification Search
    CPC .... G03B 21/16; G03B 21/2033; G03B 21/14; G03B 21/20; H01S 5/022; H01S 5/02469
           (Continued)

(56) References Cited

U.S. PATENT DOCUMENTS

2005/0265001 A1* 12/2005 Saito ................... H01L 23/4006
                                             257/E23.084
2006/0176453 A1*  8/2006 Miyamoto ........... G03B 21/008
                                               348/E5.142
(Continued)

FOREIGN PATENT DOCUMENTS

| CN | 2606906 | 3/2004 |
|---|---|---|
| CN | 208752384 | 4/2019 |

(Continued)

OTHER PUBLICATIONS

"Office Action of Taiwan Counterpart Application", issued on Aug. 30, 2022, p. 1-p. 3.

*Primary Examiner* — Magda Cruz
(74) *Attorney, Agent, or Firm* — JCIPRNET (57) ABSTRACT

A light source module, which includes a heat sink, a laser assembly, a circuit board assembly, a conductive material, and multiple lock members, is provided. The circuit board assembly includes a circuit board, which has an accommodating opening that corresponds to a beam emitter of the laser assembly. The lock members respectively pass through third lock holes of the circuit board assembly, second lock holes of the laser assembly, and first lock holes of the heat sink in sequence, thereby locking the circuit board assembly and the laser assembly on the heat sink. The accommodating opening of the circuit board exposes the beam emitter, and the conductive material connects two conductive pads of the laser assembly to two corresponding electroplated through holes, thereby enabling the laser assembly to be electrically connected to the circuit board assembly. A projector including the light source module is also provided.

10 Claims, 4 Drawing Sheets

(51) Int. Cl.
*H01S 5/022* (2021.01)
*H01S 5/024* (2006.01)

(58) Field of Classification Search
USPC .............................................. 353/65, 52, 56
See application file for complete search history.

(56) References Cited

U.S. PATENT DOCUMENTS

| 2017/0363939 | A1 | 12/2017 | Yoshida |
| 2018/0231877 | A1 | 8/2018 | Kikuchi et al. |
| 2020/0096852 | A1* | 3/2020 | Wu ..................... H01S 5/02208 |
| 2020/0336712 | A1* | 10/2020 | Shi ........................ H04N 9/315 |
| 2020/0341357 | A1 | 10/2020 | Tsai et al. |

FOREIGN PATENT DOCUMENTS

| CN | 111999970 | 11/2020 |
| CN | 108029197 | 3/2021 |
| TW | 200919074 | 5/2009 |
| TW | I377886 | 11/2012 |

\* cited by examiner

LIGHT SOURCE MODULE AND PROJECTOR

CROSS-REFERENCE TO RELATED APPLICATION

This application claims the priority benefit of China application serial no. 202110804182.8, filed on Jul. 16, 2021. The entirety of the above-mentioned patent application is hereby incorporated by reference herein and made a part of this specification.

BACKGROUND

Technical Field

This disclosure relates to a light source module and a projector, and in particular to a light source module with lower production cost and a projector that adopts the light source module.

Description of Related Art

Currently, a means of fixing a laser assembly to a printed circuit board is to weld a female connector on the printed circuit board and a male connector on the laser assembly. Then, the printed circuit board is locked on a heat sink with a set of screws, and the laser assembly is locked on the heat sink with another set of screws. After that, the external connectors on the printed circuit board are being connected through wires, and a current is energized to flow to the laser assembly via the wires on the printed circuit board, the female connector, and the male connector, so that the laser assembly generates a beam. However, the above-mentioned disposition means requires the usage of a male connector and a female connector. Furthermore, in order to prevent the printed circuit board and the laser assembly from loosening and resulting in poor contact, two sets of screws are respectively used to lock the printed circuit board and the laser assembly on the heat sink. As a result, the above-mentioned disposition means involves higher costs in using the connectors and higher processing costs of positioning the screws.

The information disclosed in this background section is only for enhancement of understanding of the background of the described technology and therefore it may contain information that does not form the prior art that is already known to a person of ordinary skill in the art. Furthermore, the information disclosed in this section does not mean that one or more problems to be resolved by one or more embodiments of the disclosure were acknowledged by a person of ordinary skill in the art.

SUMMARY

This disclosure provides a light source module with low production cost.

The disclosure also provides a projector, which includes the above-mentioned light source module, which can reduce the production cost.

Other objectives and advantages of the disclosure may be further understood from the technical features disclosed in the disclosure.

An embodiment of the disclosure provides a light source module, which includes a heat sink, a laser assembly, a circuit board assembly, a conductive material, and multiple lock members. The heat sink has multiple first lock holes. The laser assembly includes a beam emitter and two conductive pads. The two conductive pads are coupled to the beam emitter, and the laser assembly has multiple second lock holes. The circuit board assembly includes a circuit board, and the circuit board has an accommodating opening, two electroplated through holes, and multiple third lock holes. The accommodating opening communicates with the two electroplated through holes. The accommodating opening of the circuit board corresponds to the beam emitter of the laser assembly. The lock members respectively pass through the third lock holes of the circuit board assembly, the second lock holes of the laser assembly, and the first lock holes of the heat sink in sequence to lock the circuit board assembly and the laser assembly on the heat sink. The accommodating opening of the circuit board exposes the beam emitter, and the two electroplated through holes respectively correspond to the two conductive pads. The conductive material connects the two conductive pads and the two electroplated through holes, so that the laser assembly is electrically connected to the circuit board assembly.

An embodiment of the disclosure provides a projector, which includes an illumination module, a light valve, and a projection lens. The illumination module is configured to provide an illumination beam and includes a light source module. The light source module is configured to provide a laser beam, and the illumination beam includes a laser beam. The light source module includes a heat sink, a laser assembly, a circuit board assembly, a conductive material, and multiple lock members. The heat sink has multiple first lock holes. The laser assembly includes a beam emitter and two conductive pads. The two conductive pads are coupled to the beam emitter, and the laser assembly has multiple second lock holes. The circuit board assembly includes a circuit board, and the circuit board has an accommodating opening, two electroplated through holes, and multiple third lock holes. The accommodating opening communicates with the two electroplated through holes. The accommodating opening of the circuit board corresponds to the beam emitter of the laser assembly. The lock members respectively pass through the third lock holes of the circuit board assembly, the second lock holes of the laser assembly, and the first lock holes of the heat sink in sequence to lock the circuit board assembly and the laser assembly on the heat sink. The accommodating opening of the circuit board exposes the beam emitter, and the two electroplated through holes respectively correspond to the two conductive pads. The conductive material connects the two conductive pads and the two electroplated through holes, so that the laser assembly is electrically connected to the circuit board assembly. The light valve is configured on a transmission path of the illumination beam, so as to convert the illumination beam into an image beam. The projection lens is configured on a transmission path of the image beam, so as to project the image beam out of the projector.

Based on the above, the embodiments of the disclosure have at least one of the following advantages. In the design of the light source module of the disclosure, the lock members respectively pass through the third lock holes of the circuit board assembly, the second lock holes of the laser assembly, and the first lock holes of the heat sink in sequence to lock the circuit board assembly and the laser assembly on the heat sink. Therefore, the light source module of the disclosure can reduce the processing cost of tapping on the heat sink and the cost of using the lock member. Furthermore, the accommodating opening of the circuit board exposes the beam emitter, and the conductive material connects the two conductive pads and the two electroplated through holes, so that the laser assembly is electrically connected to the circuit board assembly. Therefore, the light source module of the disclosure does not require the usage of a male connector and a female connector, resulting in lower production cost. In addition, the projector adopting the light source module of the disclosure can effectively reduce the production cost.

Other objectives, features and advantages of the disclosure can be further understood from the further technological features disclosed by the embodiments of the disclosure wherein there are shown and described preferred embodiments of the disclosure, simply by way of illustration of modes best suited to carry out the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the descriptions, serve to explain the principles of the disclosure.

DESCRIPTION OF THE EMBODIMENTS

In the following detailed description of the preferred embodiments, reference is made to the accompanying drawings which form a part hereof, and in which are shown by way of illustration specific embodiments in which the disclosure may be practiced. In this regard, directional terminology, such as "top", "bottom", "front", "back" etc., is used with reference to the orientation of the figure(s) being described. The assemblys of the disclosure can be positioned in a number of different orientations. As such, the directional terminology is used for purposes of illustration and is in no way limiting. On the other hand, the drawings are only schematic and the size of the assemblys may be exaggerated for clarity. It is to be understood that other embodiments may be utilized and structural changes may be made without departing from the scope of the disclosure. Also, it is to be understood that the phraseology and terminology used herein are for the purpose of description and should not be regarded as limiting. The usage of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces" and variations thereof herein are used broadly and encompass direct and indirect facing, and "adjacent to" and variations thereof herein are used broadly and encompass directly and indirectly "adjacent to". Therefore, the description of "A" assembly facing "B" assembly herein may contain the situations that "A" assembly directly faces "B" assembly or one or more additional assemblys are between "A" assembly and "B" assembly. Also, the description of "A" assembly "adjacent to" "B" assembly herein may contain the situations that "A" assembly is directly "adjacent to" "B" assembly or one or more additional assemblys are between "A" assembly and "B" assembly. Accordingly, the drawings and descriptions will be regarded as illustrative in nature and not as restrictive.

Figure 1:
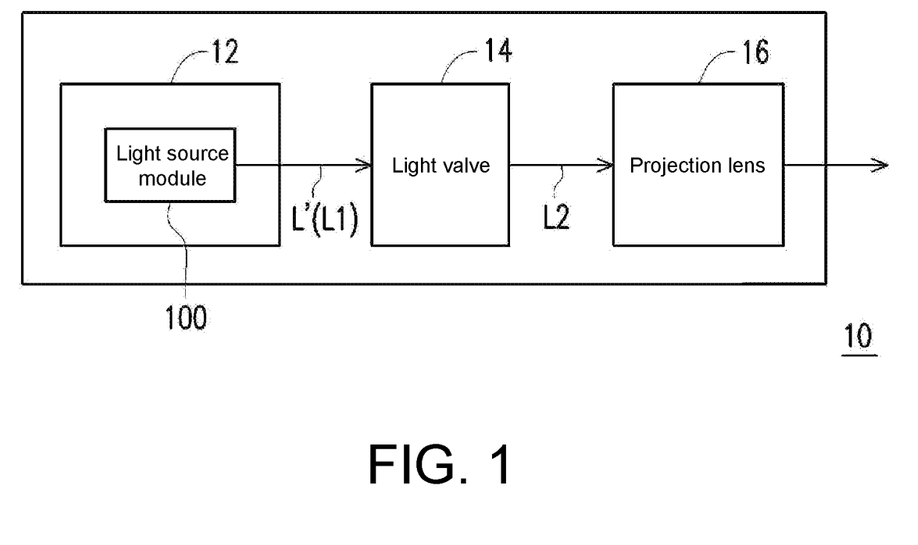
FIG. 1 is a schematic view of a projector according to an embodiment of the disclosure.

FIG. 1 is a schematic view of a projector according to an embodiment of the disclosure. With reference to FIG. 1, in the embodiment, a projector 10 includes an illumination module 12, a light valve 14, and a projection lens 16. The illumination module 12 is configured to provide an illumination beam L1 and includes a light source module 100. The light source module 100 is configured to provide a laser beam L', and the illumination beam L1 includes a laser beam L'. The light valve 14 is configured on a transmission path of the illumination beam L1 to convert the illumination beam L1 into an image beam L2. The projection lens 16 is configured on a transmission path of the image beam L2 coming from the light valve 14, so as to project the image beam L2 out of the projector 10.

More specifically, the light valve 14 used in the embodiment is, for example, a reflective light modulator such as a liquid crystal on silicon panel (LCoS panel), or a digital micro-mirror device (DMD). In an embodiment, the light valve 14 is, for example, a transmissive light modulator such as a transparent liquid crystal panel, an electro-optic modulator, a magneto-optic modulator, or an acousto-optic modulator (AOM), but the embodiment does not limit the form and type of the light valve 14. Sufficient teaching, suggestion, and implementation description of detailed steps and implementation means of a method of modulating the illumination beam L1 to the image beam L2 by the light valve 14 may be obtained from the common knowledge in the field, and therefore are not repeated here. In addition, the projection lens 16 includes, for example, a combination of one or more optical lenses having refractive power, such as various combinations of non-planar lenses such as a biconcave lens, a biconvex lens, a meniscus lens, a convex-concave lens, a plano-convex lens, and a plano-concave lens. In an embodiment, the projection lens 16 may also include a flat optical lens to convert the image beam L2 coming from the light valve 14 into a projection beam through a reflective means or a transmissive means, and project the projection beam out of the projector 10. Herein, the embodiment does not limit the form and type of the projection lens 16.

Figure 2A:
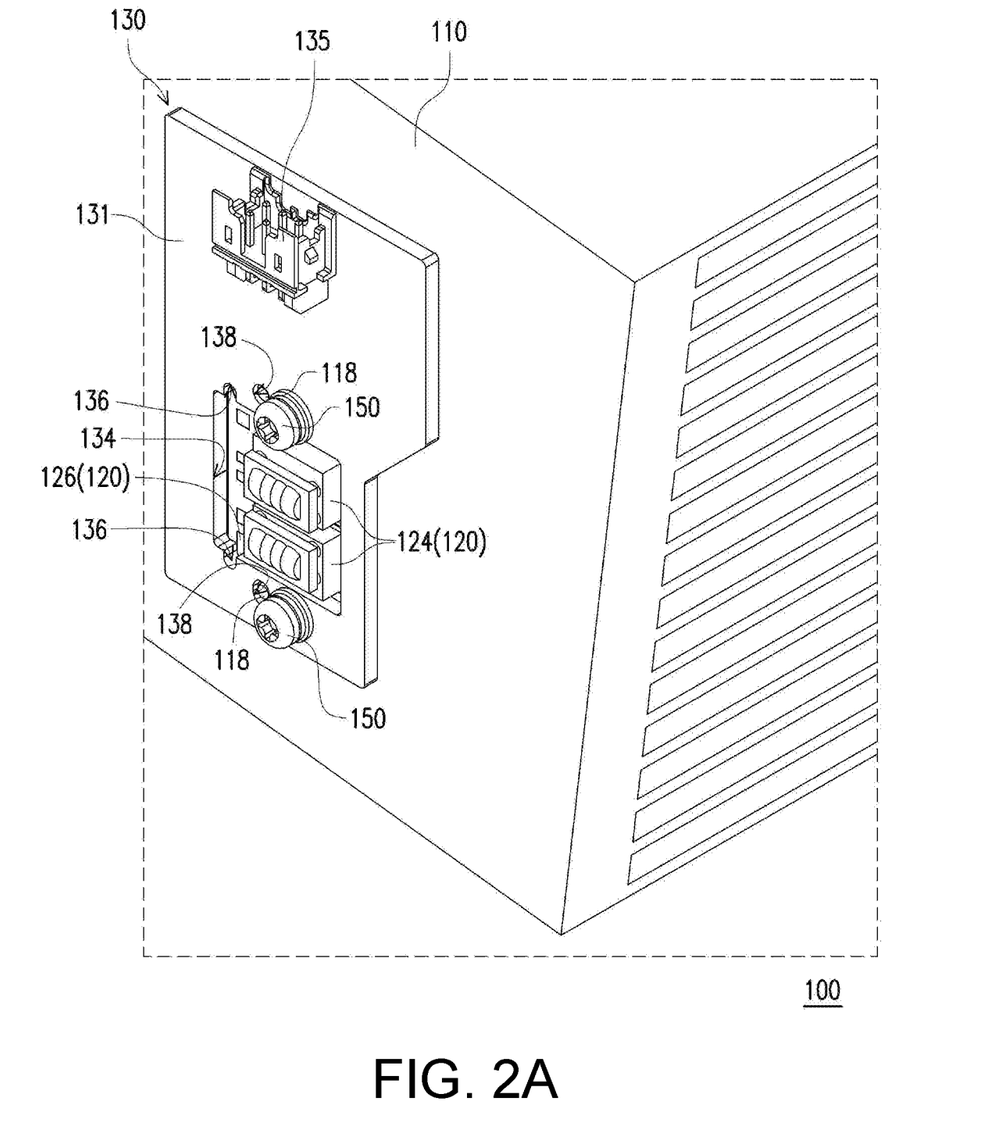
FIG. 2A is a three-dimensional schematic view of the light source module of the projector in FIG. 1.
Figure 2B:
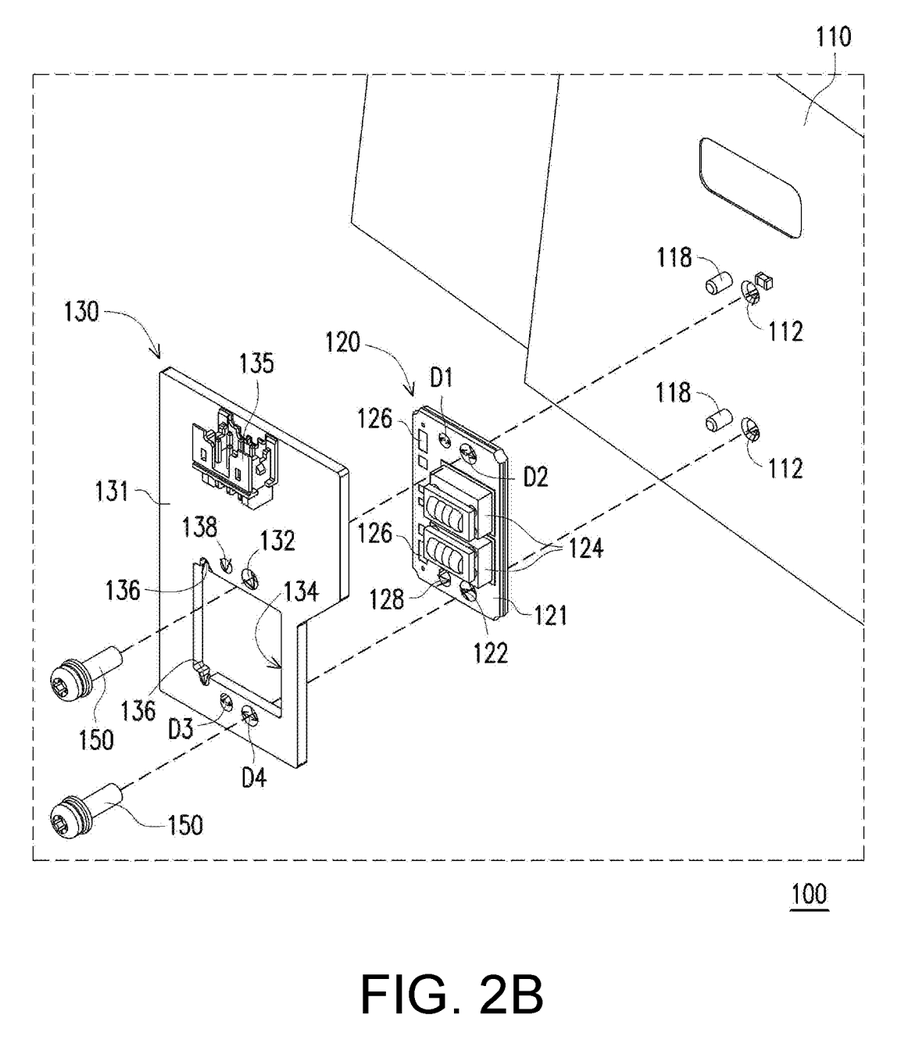
FIG. 2B is a three-dimensional exploded schematic view of the light source module in FIG. 2A.
Figure 2C:
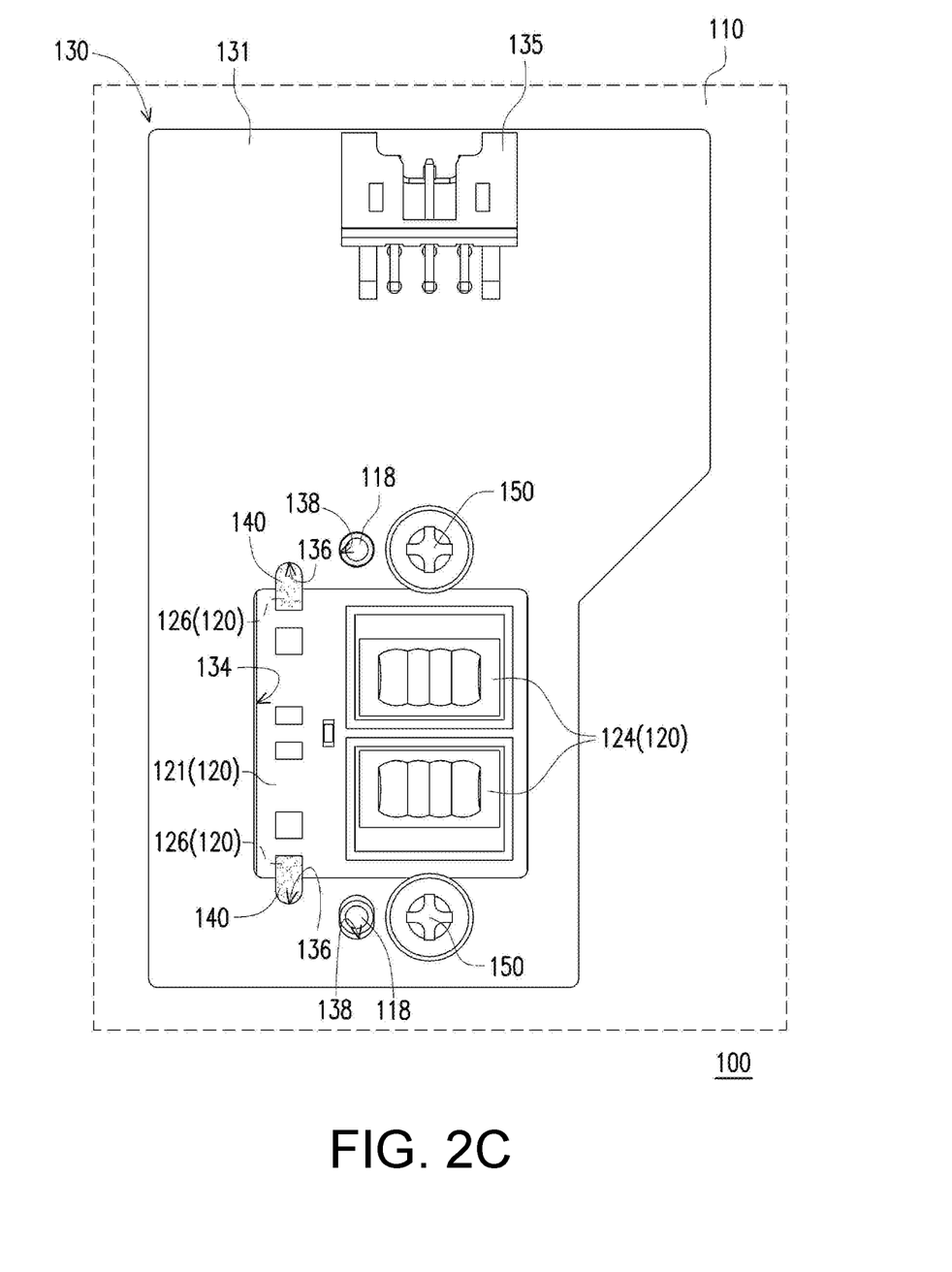
FIG. 2C is a schematic partial side view of the light source module in FIG. 2A.

FIG. 2A is a three-dimensional schematic view of the light source module of the projector in FIG. 1. FIG. 2B is a three-dimensional exploded schematic view of the light source module in FIG. 2A. FIG. 2C is a schematic partial side view of the light source module in FIG. 2A. For the convenience of description, a conductive material is omitted in FIGS. 2A and 2B.

With reference to FIGS. 2A to 2C concurrently, in the embodiment, the light source module 100 includes a heat sink 110, a laser assembly 120, a circuit board assembly 130, a conductive material 140, and multiple lock members 150. The heat sink 110 has multiple first lock holes 112. The laser assembly 120 includes a beam emitter 124 and two conductive pads 126. The two conductive pads 126 are coupled to the beam emitter 124, and the laser assembly 120 has multiple second lock holes 122. The circuit board assembly 130 includes a circuit board 131, and the circuit board 131 has an accommodating opening 134, two electroplated through holes 136, and multiple third lock holes 132. The accommodating opening 134 communicates with the two electroplated through holes 136, and the accommodating opening 134 of the circuit board 131 corresponds to the beam emitter 124 of the laser assembly 120.

In particular, the lock members 150 may pass through the third lock holes 132 of the circuit board assembly 130, the second lock holes 122 of the laser assembly 120, and the first lock holes 112 of the heat sink 110 in sequence to lock the circuit board assembly 130 and the laser assembly 120 on the heat sink 110. Here, the number of the lock members 150 is embodied as two, and there are also respectively two of the third lock hole 132, two of the second lock hole 122, and two of the first lock hole 112. The two third lock holes 132 on the circuit board 131 are, for example, respectively located on an upper side and a lower side of the accommodating opening 134. The two second lock holes 122 of the laser assembly 120 respectively correspond to the two third lock holes 132 and are respectively located on an upper side and a lower side of the beam emitter 124. The two first lock holes 112 of the heat sink 110 respectively correspond to the two second lock holes 122. The lock members 150 are, for example, multiple screws or multiple bolts. In other words, only two first lock holes 112 are required to be manufactured on the heat sink 110, and the circuit board assembly 130 and the laser assembly 120 may be locked on the heat sink 110 through the two lock members 150. Compared with the related art, which requires different openings on the heat sink for the printed circuit board and the laser assembly, the design of the light source module 100 of the embodiment can effectively reduce the processing cost of the tapping on the heat sink 110 and reduce the number of the lock member 150 used, so as to reduce the cost of using the lock member 150.

With reference to FIGS. 2B and 2C concurrently, the accommodating opening 134 of the circuit board 131 of the embodiment exposes the beam emitter 124 of the laser assembly 120, and the two electroplated through holes 136 of the circuit board 131 respectively correspond to the two conductive pads 126 of the laser assembly 120. In particular, the conductive material 140 connects the two conductive pads 126 to the two electroplated through holes 136, so that the laser assembly 120 is electrically connected to the circuit board assembly 130. In other words, in the embodiment, the laser assembly 120 is electrically connected to the circuit board assembly 130 through the conductive material 140. Here, the conductive material 140 is, for example, a solder paste, but is not limited thereto. Compared with the related art in which a male connector and a female connector are used for electrical connection, the light source module 100 of the embodiment can effectively reduce the production cost.

Furthermore, the laser assembly 120 of the embodiment further includes a board 121. The second lock hole 122 is disposed on the board 121, and the beam emitter 124 and the two conductive pads 126 are disposed on one side of the board 121. As shown in FIG. 2B, a size of the board 121 is smaller than a size of the circuit board 131, therefore when the lock member 150 is locked, a portion of the board 121 is sandwiched between the circuit board 131 and the heat sink 110.

Furthermore, with reference to FIG. 2B again, the heat sink 110 of the embodiment has multiple guide members 118. The guide members 118 are respectively located beside the first lock holes 112. The board 121 of the laser assembly 120 has multiple first guide holes 128, and the first guide holes 128 are respectively located beside the second lock holes 122. Diameters D1 of the first guide holes 128 are respectively smaller than diameters D2 of the second lock holes 122. The circuit board 131 of the circuit board assembly 130 has multiple second guide holes 138, and the second guide holes 138 are respectively located beside the third lock holes 132. Diameters D3 of the second guide holes 138 are respectively smaller than diameters D4 of the third lock holes 132. The guide members 118 of the heat sink 110 passes through the first guide holes 128 of the board 121 and the second guide holes 138 of the circuit board 131 in sequence when the laser assembly 120 and the circuit board assembly 130 are assembled, thereby guiding the laser assembly 120 and the circuit board assembly 130 to be configured on the heat sink 110.

In addition, the circuit board assembly 130 of the embodiment further includes a connector 135, which is configured on the circuit board 131 and coupled to the circuit board 131. The connector 135 is configured to provide power through a wire, which is transmitted to the beam emitter 124 of the laser assembly 120 via the two electroplated through holes 136 of the circuit board 131, the conductive material 140, and the two conductive pads 126, so that the beam emitter 124 emits the laser beam. In the embodiment, the beam emitter 124 may be, for example, a laser diode or a laser diode array.

During assembling, the laser assembly 120 is first configured on the heat sink 110 to allow the accommodating opening 134 of the circuit board 131 to correspond to the beam emitter 124 of the laser assembly 120, so as to expose the beam emitter 124, so that a portion of the board 121 of the laser assembly 120 is sandwiched between the circuit board 131 and the heat sink 110. Then, the third lock holes 132 of the circuit board 131 are configured to respectively correspond to the second lock holes 122 of the laser assembly 120 and the first lock holes 112 of the heat sink 110, and the two electroplated through holes 136 of the circuit board 131 respectively correspond to the two conductive pads 126 of the laser assembly 120. Subsequently, the lock members 150 pass through the third lock holes 132, the second lock holes 122, and the first lock holes 112 in sequence to lock the circuit board assembly 130 and the laser assembly 120 on the heat sink 110. After that, the two electroplated through holes 136 on the circuit board 131 and the two conductive pads 126 of the laser assembly 120 are welded together through the conductive material 140, so that the circuit board assembly 130 is electrically connected to the laser assembly 120. Finally, the connector 135 on the circuit board assembly 130 may be connected by a wire to provide power, which is transmitted to the beam emitter 124 of the laser assembly 120 via the two electroplated through holes 136, the conductive material 140, and the two conductive pads 126, thereby enabling the beam emitter 124 to emit a laser beam.

In short, the circuit board assembly 130 and the laser assembly 120 of the embodiment use the same set of lock holes (that is, the first lock holes) on the heat sink 110, therefore the light source module 100 of the embodiment may reduce the processing cost of the tapping on the heat sink 110 and the cost of using the lock member 150. In addition, the two electroplated through holes 136 on the circuit board 131 and the two conductive pads 126 of the laser assembly 120 are electrically connected through the conductive material 140, and then the embodiment is energized through a wire in connection with the connector 135, so that the current is transmitted to the beam emitter 124 of the laser assembly 120 via the two electroplated through holes 136, the conductive material 140, and the two conductive pads 126, thereby enabling the beam emitter 124 to emit a laser beam. Therefore, the light source module 100 of the embodiment does not require the usage of a male connector and a female connector, resulting in lower production cost.

The embodiments of the disclosure have at least one of the following advantages. In the design of the light source module of the disclosure, the lock members respectively pass through the third lock holes of the circuit board assembly, the second lock holes of the laser assembly, and the first lock holes of the heat sink in sequence to lock the circuit board assembly and the laser assembly on the heat sink. Therefore, the light source module of the disclosure can reduce the processing cost of tapping on the heat sink and the cost of using the lock member. Furthermore, the accommodating opening of the circuit board exposes the beam emitter, and the conductive material connects the two conductive pads and the two electroplated through holes, so that the laser assembly is electrically connected to the circuit board assembly. Therefore, the light source module of the disclosure does not require the usage of a male connector and a female connector, resulting in lower production cost. In addition, the projector adopting the light source module of the disclosure can effectively reduce the production cost.

The foregoing description of the preferred embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby enabling persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the terms "the invention", "the present disclosure" or the like does not necessarily limit the claim scope to a specific embodiment, and the reference to particularly preferred exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the disclosure. It should be appreciated that variations may be made in the embodiments described by persons skilled in the art without departing from the scope of the disclosure as defined by the following claims. Moreover, no element and assembly in the disclosure is intended to be dedicated to the public regardless of whether the element or assembly is explicitly recited in the following claims.

What is claimed is:

1. A light source module, comprising a heat sink, a laser assembly, a circuit board assembly, a conductive material, and a plurality of lock members, wherein
   the heat sink has a plurality of first lock holes,
   the laser assembly comprises a beam emitter and two conductive pads, the two conductive pads are coupled to the beam emitter, and the laser assembly has a plurality of second lock holes,
   the circuit board assembly comprises a circuit board, the circuit board has an accommodating opening, two electroplated through holes, and a plurality of third lock holes, and the accommodating opening communicates with the two electroplated through holes,
   the accommodating opening of the circuit board corresponds to the beam emitter of the laser assembly, and the plurality of lock members respectively pass through the plurality of third lock holes of the circuit board assembly, the plurality of second lock holes of the laser assembly, and the plurality of first lock holes of the heat sink in sequence, the circuit board assembly and the laser assembly are locked on the heat sink, the accommodating opening of the circuit board exposes the beam emitter, the two electroplated through holes respectively correspond to the two conductive pads, and the conductive material connects the two conductive pads to the two electroplated through holes, thereby enabling the laser assembly to be electrically connected to the circuit board assembly.

2. The light source module according to claim 1, wherein the laser assembly further comprises:
   a board, having the plurality of second lock holes, wherein the beam emitter and the two conductive pads are configured on one side of the board, and a portion of the board is sandwiched between the circuit board and the heat sink.

3. The light source module according to claim 2, wherein the heat sink has a plurality of guide members, the board of the laser assembly has a plurality of first guide holes, the circuit board of the circuit board assembly has a plurality of second guide holes, and the plurality of guide members of the heat sink respectively pass through the plurality of first guide holes of the board and the plurality of second guide holes of the circuit board in sequence, thereby guiding the laser assembly and the circuit board assembly to be configured on the heat sink.

4. The light source module according to claim 3, wherein the plurality of guide members are respectively located beside the plurality of first lock holes, the plurality of first guide holes are respectively located beside the plurality of second lock holes, and the plurality of second guide holes are respectively located beside the plurality of third lock holes.

5. The light source module according to claim 3, wherein diameters of the plurality of first guide holes are respectively smaller than diameters of the plurality of second lock holes, and diameters of the plurality of second guide holes are respectively smaller than diameters of the plurality of third lock holes.

6. The light source module according to claim 1, wherein the circuit board assembly further comprises:
   a connector, configured on the circuit board and coupled to the circuit board.

7. The light source module according to claim 6, wherein the connector is configured to provide power through a wire, which is transmitted to the beam emitter of the laser assembly via the two electroplated through holes of the circuit board, the conductive material, and the two conductive pads, thereby enabling the beam emitter to emit a laser beam.

8. The light source module according to claim 1, wherein the conductive material comprises solder paste.

9. The light source module according to claim 1, wherein the plurality of lock members comprise a plurality of screws or a plurality of bolts.

10. A projector, comprising an illumination module, a light valve, and a projection lens, wherein the illumination module is configured to provide an illumination beam and comprises a light source module, the light source module is configured to provide a laser beam, the illumination beam comprises the laser beam, and the light source module comprises a heat sink, a laser assembly, a circuit board assembly, a conductive material, and a plurality of lock members, wherein the heat sink has a plurality of first lock holes, the laser assembly comprises a beam emitter and two conductive pads, the two conductive pads are coupled to the beam emitter, and the laser assembly has a plurality of second lock holes, the circuit board assembly comprises a circuit board, the circuit board has an accommodating opening, two electroplated through holes, and a plurality of third lock holes, and the accommodating opening communicates with the two electroplated through holes, the accommodating opening of the circuit board corresponds to the beam emitter of the laser assembly, and the plurality of lock members respectively pass through the plurality of third lock holes of the circuit board assembly, the plurality of second lock holes of the laser assembly, and the plurality of first lock holes of the heat sink in sequence, the circuit board assembly and the laser assembly are locked on the heat sink, the accommodating opening of the circuit board exposes the beam emitter, the two electroplated through holes respectively correspond to the two conductive pads, and the conductive material connects the two conductive pads to the two electroplated through holes, thereby enabling the laser assembly to be electrically connected to the circuit board assembly, the light valve is configured on a transmission path of the illumination beam to convert the illumination beam into an image beam, and the projection lens is configured on a transmission path of the image beam to project the image beam out of the projector.

* * * * *